United States Patent
Morf et al.

(10) Patent No.: US 7,548,053 B2
(45) Date of Patent: Jun. 16, 2009

(54) WIDE-BAND ANTENNA COUPLED SPECTROMETER USING CMOS TRANSISTOR

(75) Inventors: Thomas E. Morf, Gross (CH); Thomas H. Toifl, Zurich (CH)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 12/184,052

(22) Filed: Jul. 31, 2008

(65) Prior Publication Data

US 2009/0009154 A1    Jan. 8, 2009

Related U.S. Application Data

(63) Continuation-in-part of application No. 11/774,087, filed on Jul. 6, 2007.

(51) Int. Cl.
   *G01R 31/00* (2006.01)
(52) U.S. Cl. ........................................ 324/96
(58) Field of Classification Search .................. 324/96
   See application file for complete search history.

(56) References Cited

U.S. PATENT DOCUMENTS

| | | | |
|---|---|---|---|
| 5,436,453 | A | 7/1995 | Chang et al. |
| 5,777,329 | A | 7/1998 | Westphal et al. |
| 5,914,497 | A * | 6/1999 | Sherwin ............ 257/21 |
| 5,965,873 | A | 10/1999 | Simpson et al. |
| 2002/0018203 | A1 | 2/2002 | Battle et al. |
| 2005/0224714 | A1 | 10/2005 | Akin et al. |
| 2006/0176485 | A1 | 8/2006 | Bulovic et al. |
| 2007/0121687 | A1 | 5/2007 | Amantea |
| 2007/0138402 | A1 | 6/2007 | Hyde et al. |
| 2007/0165222 | A1 | 7/2007 | Bouzid et al. |
| 2007/0182408 | A1 | 8/2007 | Blanz et al. |
| 2007/0194253 | A1 | 8/2007 | Nishizawa et al. |
| 2007/0260146 | A1 | 11/2007 | Ou-Yang et al. |
| 2008/0043102 | A1 | 2/2008 | Rowe et al. |

FOREIGN PATENT DOCUMENTS

WO    WO 2007-128140    11/2007

OTHER PUBLICATIONS

An Ultrafast Geiger-Mode Single Photon Avalanche Diode in 0.18 μM CMOS Technology, Hod Finkelstein et al., in *Advanced Photon Counting Techniques*, Wolfgang Becker, Editor, Proceedings of SPIE vol. 6372, pp. 63270W1-63270W10, 2006.

(Continued)

*Primary Examiner*—Diego Gutierrez
*Assistant Examiner*—Amy He
(74) *Attorney, Agent, or Firm*—Oppenheimer Wolff & Donnelly LLP

(57) ABSTRACT

To create a broad band spectrometer, a plurality of individual antenna based bolometers are fabricated on the surface of a single spectrometer chip, each bolometer having an individual antenna which is sized differently from all others, thus being responsive to a generally unique frequency of radiation. Each antenna is coupled to a related transistor, which is easily formed using CMOS technology. The antennas are connected to opposite sides of a transistor gate, thus creating a termination resistor for the particular antenna. Multiple outputs from the various antennas are then coupled, thus providing responsiveness to electromagnetic radiation of a very broad spectrum.

1 Claim, 10 Drawing Sheets

OTHER PUBLICATIONS

Micro-Atmospheric Testing, John DeGaspari, in *Mechanical Engineering*, vol. 127, Iss. 4, p. 14, Apr. 2005.

Development of a High-Rate High-Resolution Detector for EXAFS Experiments, G. De Geronimo et al., in *IEEE Transactions on Nuclear Science*, vol. 50, Iss. 4, pp. 885-891, Aug. 2003.

Microfluidic Integration on Detector Array for Absorption and Fluorescence Micro-Spectrometers, Mark L. Adams et al., in *Sensors and Actuators A: Physical*, vol. 104, Iss. 1, pp. 25-31, Mar. 15, 2003.

Packaging of Large-Area, Individually Addressable, Micro-Mirror Arrays for the Next Generation Space Telescope, G-Q. Lu et al., in *Design, Test, Integration, and Packaging of MEMS/MOEMS 2002*, Bernard Courtois, Jean Michel Karam, Karen W. Markus, Bernd Michel, Tamal Mukherjee, James A. Walker, Editors, Proceedings of SPIE vol. 4755, pp. 521-530, 2002.

Single-Chip CMOS Optical Microspectrometer, J.H. Correia et al., in *Sensors and Actoators A: Physical*, vol. 82, Iss. 1-3, pp. 191-197, May 15, 2000.

On-Chip Integrated CMOS Optical Microspectrometer With Light-to-Frequency Converter and Bus Interface, G. de Graaf et al., in *Solid-State Circuits Conference, 1999. Digest of Technical Papers. ISSCC. 1999 IEEE International*, pp. 208-209 and 462, 1999.

XPS: A Multi-Channel Preamplifier-Shaper IC for X-Ray Spectroscopy, B. Krieger et al., in 1997 *IEEE Nuclear Science Symposium Conference Record*, pp. 5-7, 1997.

A Far-Infrared Fourier Transform Spectrometer With an Antenna-Coupled Niobium Bolometer, D F Santavicca et al., *Supercond. Sci. Technol.* 20 (2007) pp. S398-S402.

Microbolometer Spectrometer: Applications and Technology, Johan Leijtens, Andrew Court, Jan Hoegee; *ICMENS, Proceedings of the 2004 International Conference on MEMS, NANO and Smart Systems*, Aug. 25-27, 2004 pp. 402-408.

Antenna-Coupled Niobium Bolometers for Terahertz Spectroscopy, Santavicca, D.F.; Reese, M.O.; True, A.B.; Schmuttenmaer, C.A.; Prober, D.E.; *IEEE Transactions on Applied Superconductivity*, vol. 17, Issue 2, Jun. 2007 pp. 412-415.

* cited by examiner

205

WIDE-BAND ANTENNA COUPLED SPECTROMETER USING CMOS TRANSISTOR

RELATED APPLICATIONS

This application is a continuation-in-part of U.S. patent application Ser. No. 11/774,087 entitled DETECTOR FOR DETECTING ELECTROMAGNETIC WAVES, filed Jul. 6, 2007.

FIELD OF THE INVENTION

The present invention relates to a chip based spectrometer utilizing CMOS technology. More specifically, the present invention relates to a CMOS spectrometer made up of multiple antenna elements, with each antenna element operatively coupled to the gate of a corresponding CMOS transistor.

BACKGROUND OF THE INVENTION

Detectors and sensors of all different types are utilized in virtually every walk of life. The miniaturization and efficiency of any sensor is a continuous goal for device designers. Stated alternatively, it is almost always beneficial to design and develop sensors and detectors which are more efficient and which can be packaged as smaller devices. By developing small efficiently operating sensors, various additional applications are typically made possible. This is specifically applicable to sensors which detect different types of radiation.

One known method for detecting radiation is by means of optical detectors that convert a photon into an electron via electron/hole generation upon impact of a photon in a generation/recombination zone. The sum of the electrons/holes generated by the photons represents a signal current that corresponds to the received optical power. This is equivalent to the number of photons incident to the detector that are actually converted to electrons. The conversion is typically done in a photo diode.

Another way of converting light involves treating the light signal as an electromagnetic wave and detecting via antennas or absorbing area. In an antenna coupled Bolometer, the energy of the electromagnetic wave received by the antenna is absorbed in a sensor element, which leads to an increase in temperature in the sensor element. The change in temperature causes a change in the electrical properties of the sensor element (e.g. a change in electrical resistance or change of the tunneling current in a semiconductor).

Existing CMOS based sensors, which are effective for their given purposes, allows for the generation of the far-infrared bolometer. Far-infrared bolometers of many different types presently exist, however they are not efficiently designed for speed and responsiveness.

Using a frequency selective antenna, a bolometer which responds to radiation of a particular frequency can be envisioned. That is, the bolometer is designed to detect a prescribed frequency of radiation, and then produce an appropriate output signal. Using an array of different sized antenna coupled bolometers, a wide frequency range can be covered. Typically, these revised devices are spectrometers, which are useful for many different applications. Spectrometers are typically utilized to detect wide band spectral characteristics. A spectrometer is particularly useful, and essential, for chemical analysis in many types of areas.

As such, there is a need for compact spectrometers, which can easily be implemented in microelectronic chip format. Further, there is a need for a compact spectrometer which is efficient and responsive to a broad spectrum of radiation.

BRIEF SUMMARY OF THE INVENTION

The present invention provides chip based spectrometers which are operable and sensitive across wide frequency ranges, thus useable for many different applications. The spectrometer makes use of multiple antennas, each configured to be responsive to a selected frequency or range of frequencies. All of these multiple antennas can be easily realized as part of a single chip, thus providing a very compact spectrometer. Further, due to the very small size of the necessary antennas, a large number of antennas may exist on the chip, thus providing a broad range of responsiveness. Each antenna can easily be positioned relative to a related CMOS transistor, resulting in the effective operation of the device as a broad band spectrometer.

This device more specifically includes a number of antennas with each coupled to the gate of a corresponding transistor. This configuration provides a far infrared based spectrometer. When infrared radiation is presented to each antenna, this radiation is converted to electrical current. Two terminals of the antenna are connected to the two sides of a MOSFET gate. This way, the MOSFET gate resistance acts as the terminating resistor of the antenna. This antenna current is converted to heat at the transistor gate and changes the operating temperature, and the leakage characteristics of the transistor. By detecting these changes in operation, the above-referenced infrared radiation is detected as an electrical signal that can be utilized by subsequent devices.

As outlined above, the incorporation of multiple antenna based bolometers allows for detecting a broader spectrum of IR radiation thus providing spectrometer capabilities. That said, each of these antennas are typically specifically designed and configured to detect IR radiation within a specific frequency range. This is primarily due to the geometry of the antenna itself which is sensitive to a particular frequency. By selecting a narrow band high Q antenna, it is possible to construct bolometers which are sensitive to a very focused frequency range. A large number of antennas with each having a slightly different mechanical dimension allows for the coverage of a large frequency range.

As mentioned above, the broad band sensitivity necessary for spectrometers can often be challenging. The present invention addresses this challenge by providing wavelength accuracy due to the mechanical dimensions of each particular antenna. As the physical structure making up the antenna can be easily controlled on a silicon chip, accurate antennas are thus produced. Further, wavelength accuracy is often affected by dielectric properties of materials used in the back end of the line CMOS process (BEOL). However, in a spectrometer using a known substance and having known absorption lines, calibration can easily be performed. In addition, drift will thus affect all antennas similarly, and thus not have effects on the overall spectrometer operation.

According to a first aspect of the present invention, there is presented a detector for detecting electromagnetic waves, including a plurality of antennas for receiving the electromagnetic waves, and a plurality of related semiconductor elements attached to each antenna (i.e., the gate of a corresponding transistor). A termination section of the semiconductor element establishes a termination resistor of the antenna, which causes the heating of a temperature-sensitive part of the semiconductor element. The semiconductor element is temperature-dependent in that its operation is dependent on the temperature of the temperature sensitive part. Lastly, a measurement unit for measuring the temperature-dependent characteristic of the semiconductor element is utilized.

Each detector according to this aspect of the invention receives the electromagnetic waves by means of the antenna and converts the received electromagnetic radiation into heat by means of the termination section of the semiconductor element. The termination section functions as termination resistor of the antenna. The heat produced in the termination section is used for heating a temperature-sensitive part of the semiconductor device. The temperature-sensitive part can be any part of the semiconductor-element that comprises a measurable temperature-dependent characteristic. Advantageously, the termination section is arranged in the proximity of the temperature-sensitive part. Advantageously, the termination section heats the temperature-sensitive part selectively. In other words, the termination section does not heat the complete semiconductor element evenly or uniformly, but produces the heat at or in the proximity of the temperature sensitive part. In other words, the produced heat is focused on the area of the temperature sensitive part. Such a focusing of the heat on the temperature-sensitive part enhances the sensitivity of the detector.

According to a further embodiment of this aspect of the invention the semiconductor element associated with each antenna is a transistor, wherein the termination section is established by means of an electrode of the transistor and wherein the respective electrode is coupled at two termination points to an arm of the antenna.

According to this embodiment one of the electrodes of the transistor acts as termination resistor for the antenna. The respective electrode is coupled at two termination points to an arm of the antenna. The respective electrode comprises preferably a gap between the two termination points. In other words, the respective electrode comprises two parts, wherein each part is connected to one of the arms of the antenna. The termination section or termination resistor respectively can be established by using the semiconductor path between the two termination points or the two electrode parts respectively. The termination points are advantageously arranged at opposite sides of the transistor. This provides space for establishing the required matching impedance between the termination points via the semiconductor substrate. The transistor electrodes offer inexpensive contact possibilities for the antenna.

BRIEF DESCRIPTION OF THE DRAWINGS

Further objects and advantages of the present invention will be seen by reading the following detailed description, in conjunction with the drawings in which:

FIG. 6b shows a cross-section of the detector of FIG. 6a;

DETAILED DESCRIPTION OF THE INVENTION

Figure 1:
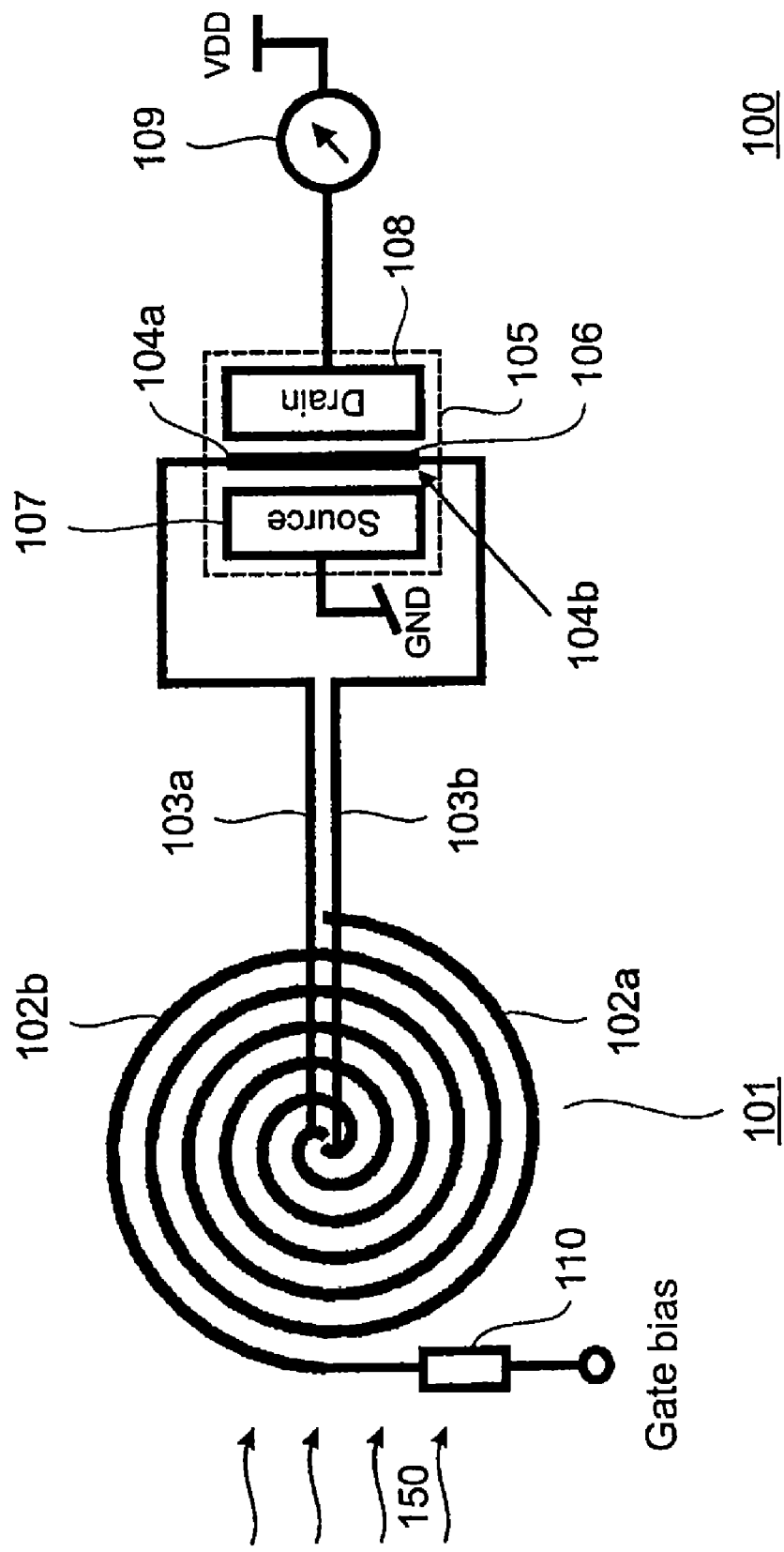
FIG. 1 shows a schematic illustration of a detector for detecting electromagnetic waves according to an embodiment of the present invention.

FIG. 1 shows a schematic illustration of a detector 100 for detecting electromagnetic waves 150 according to an embodiment of the present invention. The detector 100 is in particular suitable for detecting electromagnetic waves 150 with a frequency in the THz range. The detector 100 comprises an antenna 101 for receiving the electromagnetic waves 150. The antenna 101 can be e.g. a planar broadband antenna with a ground plane. The antenna 101 is in particular suited to receive electromagnetic waves in a wavelength range between 3 μm and 15 μm. The antenna 101 comprises a first arm 102a and a second arm 102b. The first arm 102a is connected by means of a first via 103a to a first termination point 104a and the second arm 102b is connected by means of a second via 103b to a second termination point 104b. The first termination point 104a and the second termination point 104b are contact points for contacting a gate 106 of a Field Effect Transistor (FET) 105. Thus the gate 106 of the FET 105 is connected on both sides of the FET 105 to the antenna 101. The FET 105 is preferably a Metal Oxide Semiconductor (MOS)-FET or an Insulated Gate (IG)-FET respectively. The gate resistance between the first termination point 104a and the second termination point 104b acts as termination resistor for the antenna 101. The value of the gate resistance is preferably designed in such a way that the antenna 101 is matched by means of the gate resistance. The source 107 of the FET 105 is coupled to ground potential. The drain 108 of the FET 105 is biased with a positive potential VDD. Between the drain 108 of the FET 105 and the positive potential VDD a measurement unit 109 for measuring a temperature-sensitive characteristic of the FET 105 is provided. According to this exemplary embodiment of the invention the measuring unit 109 is a current meter.

The second arm 102b of the antenna 101 is coupled to a gate bias potential via a resistor 110. The resistor 110 could be replaced by an inductor. The FET 105 is operated in sub-threshold mode, i.e. there are only leakage currents flowing.

In operation, the detector 100 receives electromagnetic waves 150 via the antenna 101. The electromagnetic energy received by the antenna 101 is converted to heat by means of the gate resistance of the gate 106. This is in turn heating up the drain-source channel of the FET 105 which functions as the temperature-sensitive part of the detector 100. This in turn affects and influences the sub-threshold gate leakage current as well as the sub-threshold drain-source leakage current of the FET 105 which can be used as a measurable temperature-dependent characteristic of the FET 105. In the embodiment shown in FIG. 1, the temperature dependent drain-source leakage current is measured by means of the measurement unit 109.

Figure 2:
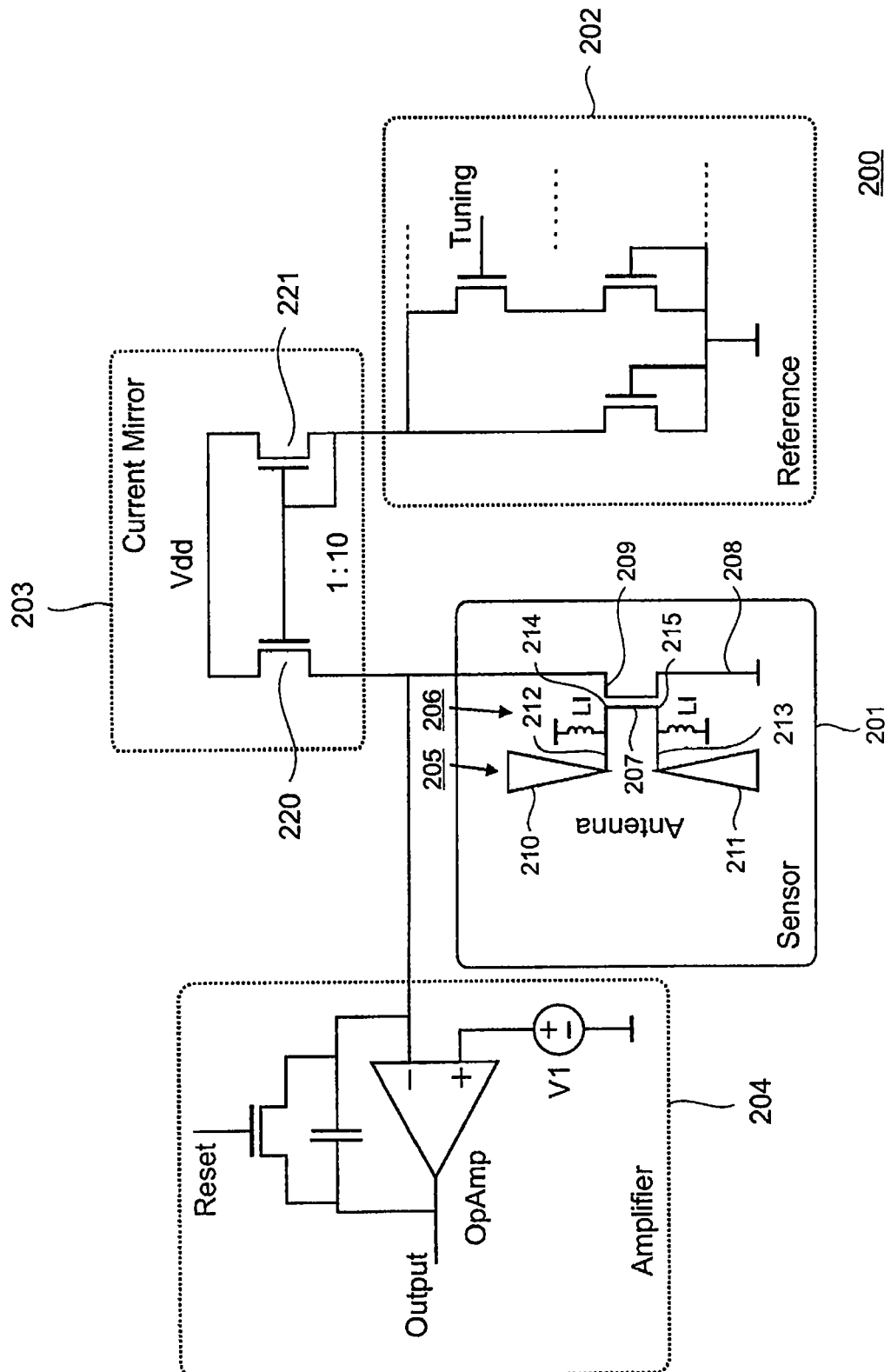
FIG. 2 shows a schematic illustration of a circuit diagram of a detector according to an embodiment of the invention.

FIG. 2 shows a circuit diagram of a readout circuit of a detector 200 according to an embodiment of the invention. The readout circuit comprises a sensor circuit 201, a reference circuit 202, a current mirror circuit 203 and an amplifier circuit 204. The sensor circuit 201 comprises an antenna 205 as well as a Field-Effect-Transistor (FET) 206. The FET 206 comprises a gate 207, a source 208 and a drain 209. The gate 207 and the source 208 are coupled to ground potential. The drain 209 is biased with a positive potential of, e.g., 1V.

The antenna 205 comprises a first arm 210 and a second arm 211 as well as a first via 212 and a second via 213. The FET 206 is a MOS-FET. The gate 207 of the FET 206 is connected at a first termination point 214 to the first via 212 and at a second termination point 215 to the second via 213.

The drain 209 is coupled to the current mirror circuit 203. The current mirror circuit 203 comprises a transistor 220 and a transistor 221. The current mirror circuit 203 mirrors the drain-source current of the FET 206 with, e.g., the factor 1:10. The current mirror circuit 203 performs effectively a subtraction of the current in the reference circuit 202 and the current in the sensor circuit 201 to reduce the required dynamic range of the rest of the readout electronic.

The reference circuit 202 comprises several switchable reference transistors to tune the readout circuit. For example, the tuning can be such that the current of the reference circuit 202 is ten times higher than the current in the sensor circuit 201.

The amplifier circuit 204 amplifies the drain-source current of the FET 206.

The FET 206 is operated in sub-threshold mode, i.e. there are only leakage currents flowing.

In operation, the detector 200 operates in the same manner as detector 100 discussed above. Specifically, detector 200 receives electromagnetic waves via the antenna 205. The electromagnetic energy received by the antenna 205 is converted to heat by means of the gate resistance of the gate 207. This is in turn heating up the drain-source channel of the FET 206 which functions as temperature-sensitive part of the detector 200. This in turn affects and influences the drain-source leakage current of the FET 206 which is amplified by means of the amplifier circuit 204 and can then be measured by a further not shown measurement unit.

Figure 3:
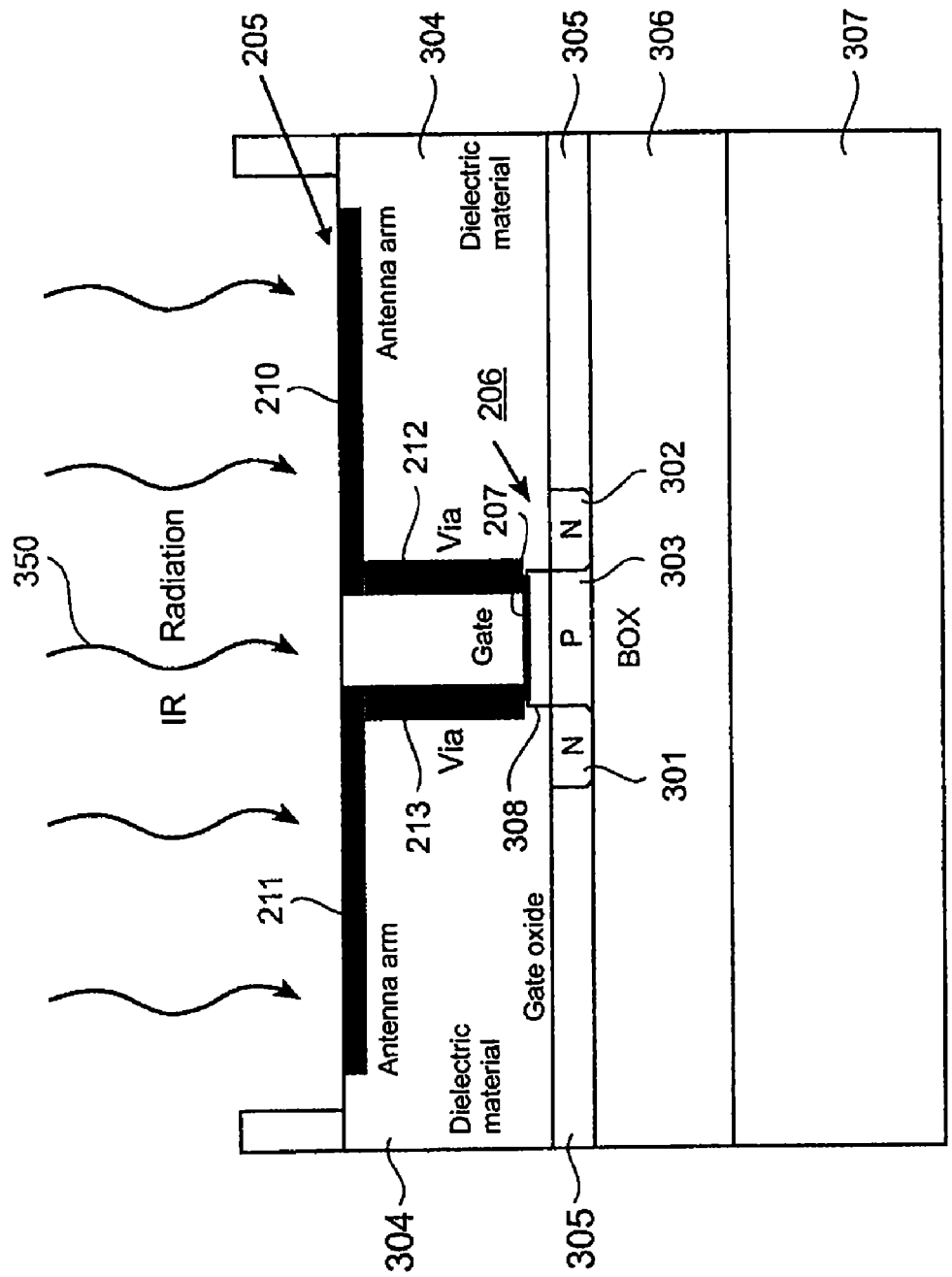
FIG. 3 shows a schematic cross-section of an integrated circuit comprising an antenna and a semiconductor element of a detector according to an embodiment of the present invention.

FIG. 3 shows a schematic cross-section of the sensor circuit 201 as shown in FIG. 2. The sensor circuit 201 is implemented as integrated circuit. It comprises the antenna 205 and the FET 206. The first arm 210 and the second arm 211 of the antenna 205 are arranged in one common plane on the surface of the sensor circuit 201. The first via 212 and the second via 213 extend orthogonal to the first arm 210 and the second arm 211. Below the gate electrode 207 an insulating layer 308 of e.g. gate oxide is arranged. The FET 206 comprises a first n-doted layer 301, a second n-doted layer 302 and in the middle a p-doted layer 303. In other words, the FET 206 is an N-channel MOS-FET. The first n-doted layer 301 is connected to a not shown source-electrode and the second n-doted layer 302 is connected to a not shown drain-electrode. The antenna 205 is a planar antenna that is arranged on a dielectric substrate 304. Next to the first n-doted layer 301 and next to the second n-doted layer 302 are arranged insulating oxide layers 305. The integrated circuit of the sensor circuit 201 comprises further a buried oxide (BOX) layer 306 and a Silicon layer 307. The antenna 205 is provided for receiving electromagnetic waves 350.

Figure 4:
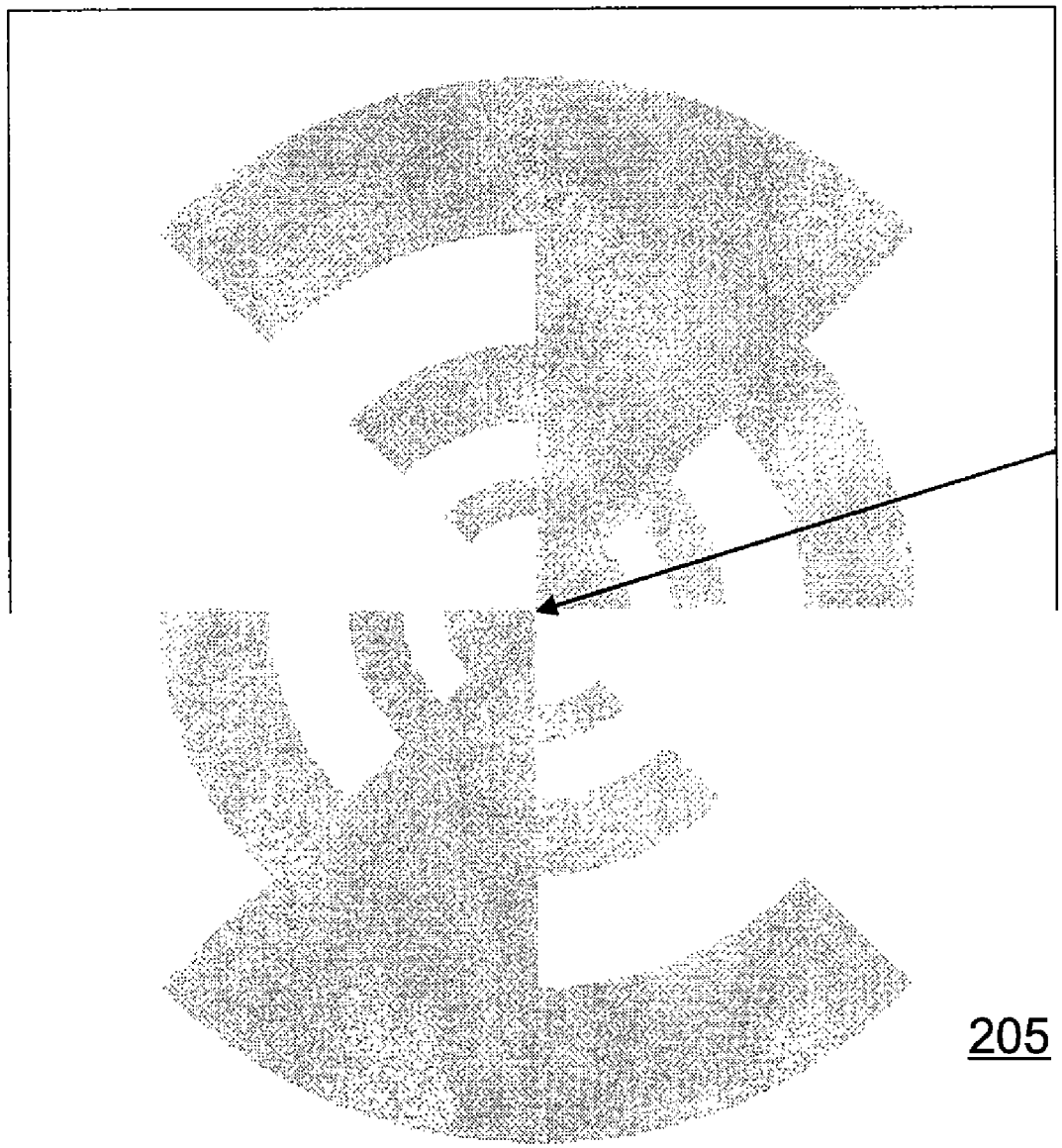
FIG. 4 shows the layout of a planar antenna of a detector according to an exemplary embodiment of the invention.

FIG. 4 shows a exemplary embodiment of a top view of the layout of the antenna 205 of FIG. 2 and FIG. 3 in more detail. It is a logarithmically periodic antenna that is designed for a wavelength range of 5 μm to 24 μm.

Figure 5:
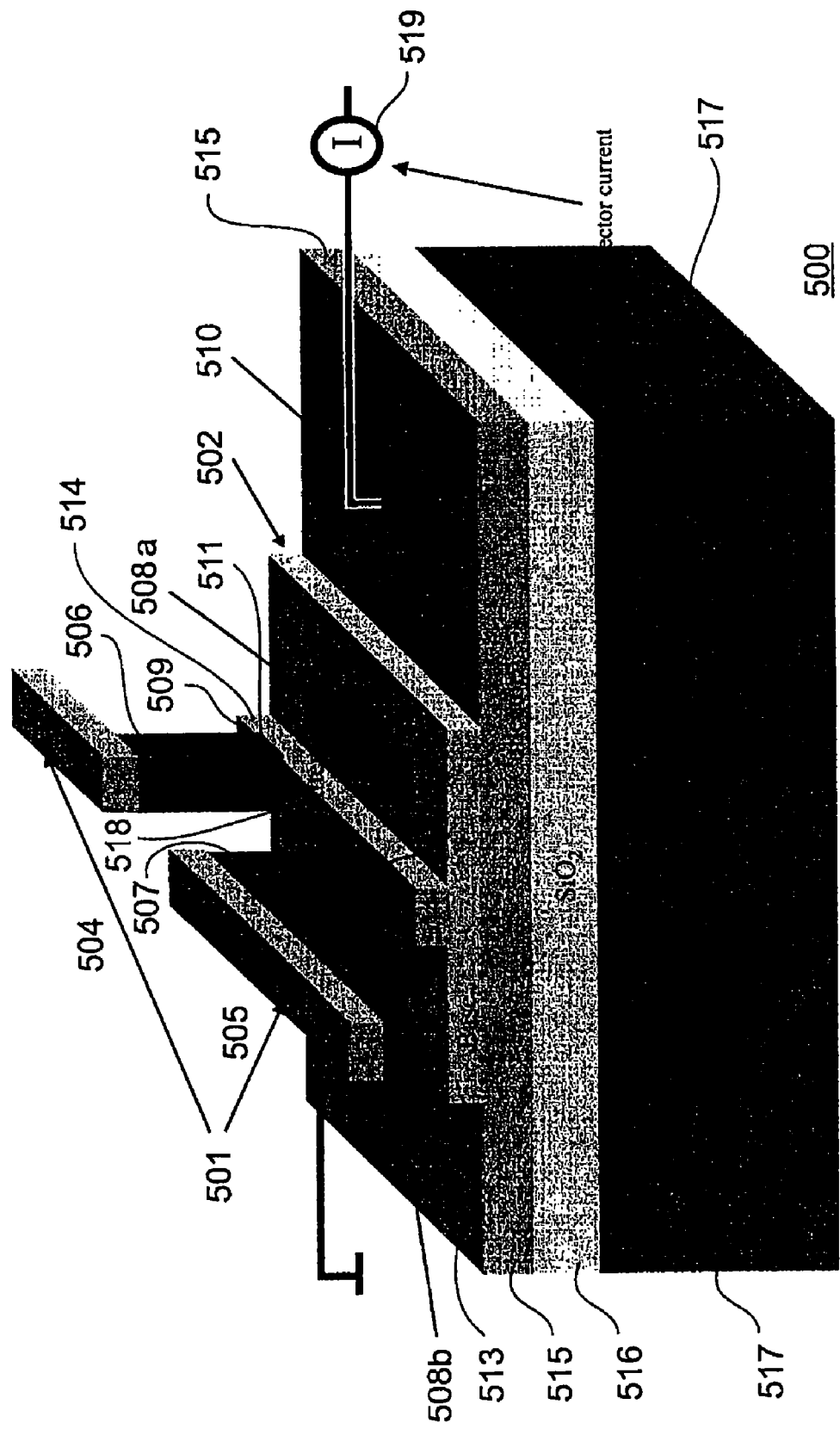
FIG. 5 shows a 3-dimensional view of another detector according to an embodiment of the present invention comprising a bipolar transistor.

FIG. 5 shows a 3-dimensional view of a detector 500 according to another embodiment of the present invention. The detector 500 is manufactured in SOI-technology. The detector 500 comprises an antenna 501 and a semiconductor element as a transistor 502. The antenna 501 comprises a first arm 504 and a second arm 505 as well as a first via 506 and a second via 507. The transistor 502 is a bipolar transistor and comprises two base electrodes 508a and 508b, an emitter electrode 509 and a collector electrode 510.

The emitter electrode 509 is connected at a first termination point or termination area 511 to the first via 506 and at a second termination point or termination area 512 to the second via 507.

The two base electrodes 508a and 508b are coupled to a base layer 513, the emitter electrode 509 to an emitter layer 514 and the collector electrode 510 to a collector layer 515.

Below the collector layer 515 there is arranged an insulating layer 516 of Silicon-Dioxide or of another thermally insulating material. Below the insulating layer 516 there is provided a base layer 517 of a semiconductor material, in particular Silicon.

The antenna 501 is schematically illustrated as dipole antenna. It can generally be any antenna that is suitable for the required frequency range. It can be e.g. implemented as planar antenna as well, e.g. by means of a planar antenna as shown in FIG. 4. In case of a planar antenna the antenna 501 would be embedded in a not shown layer of dielectric material.

In this embodiment the bipolar transistor 502 of the detector is operated in a forward-biased mode. In operation, a substantially constant base-emitter voltage is applied to the two base electrodes 508a and 508b and the emitter electrode 509. The emitter electrode 509 acts as termination resistor for the antenna 501. The emitter electrode 509 is designed in such a way that the electrical resistance between the first termination point 511 and the second termination point 512 corresponds to the matching impedance of the antenna. The electrical resistance will preferably be established by means of the emitter layer 514.

Preferably the emitter electrode 509 comprises a gap 518 between the first termination point 511 and the second termination point 512.

The electromagnetic radiation received by the antenna 501 is converted to heat by means of the electrical resistance between the first termination point 511 and the second termination point 512 of the emitter electrode 509. This is in turn heating up the base layer 513 and the collector layer 515 of the bipolar transistor 502. This in turn affects and influences the collector current which can be measured at the collector electrode 510. The collector current is measured by means of a measuring unit 519. The measuring unit 519 is implemented as current meter.

In this embodiment of the invention the collector current is used as the measurable temperature-dependent characteristic of the bipolar transistor 502.

As a further embodiment, the antenna 501 could be terminated by means of the two base electrodes 508a and 508b. Then the resistance between the two base electrodes 508a and 508b (the resistance of the base layer 513) would establish the termination resistor for the antenna 501.

According to a further embodiment of the invention the bipolar transistor 502 can be operated in the sub-threshold area, i.e. in a reverse-biasing mode. In this embodiment the sub-threshold base leakage current in the base layer 513 or the sub-threshold collector-emitter leakage current in the emitter layer 514 or the collector layer 515 can be used as measurable temperature-dependent characteristic of the bipolar-transistor 502.

Figure 6A:
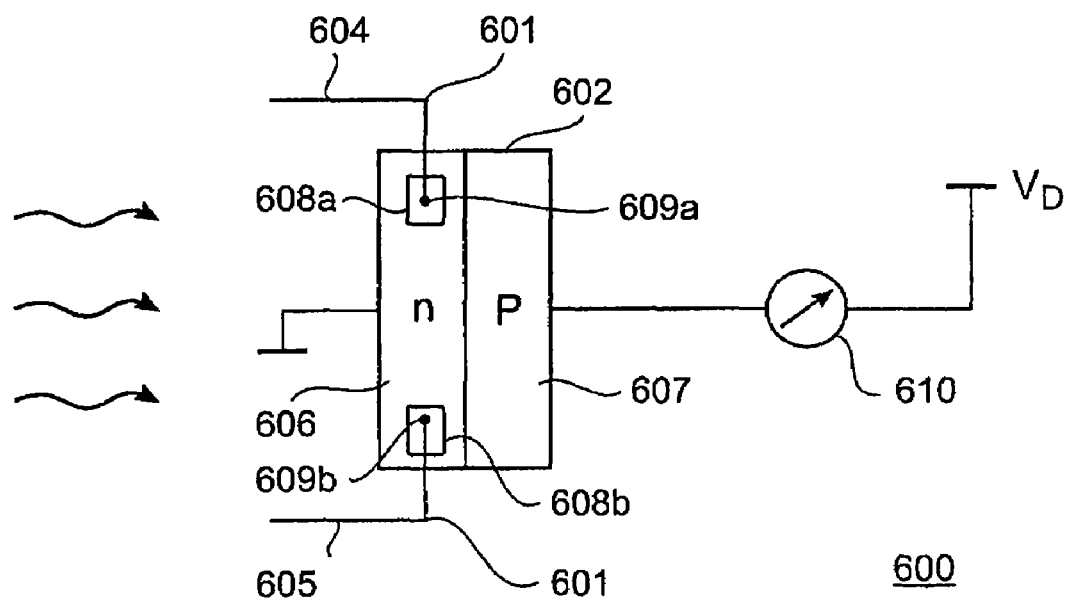
FIG. 6a shows a top view of another detector according to an embodiment of the present invention comprising a diode.

FIG. 6a shows a top view of a detector 600 according to a further embodiment of the invention. The detector 600 comprises an antenna 601 and as the semiconductor element a diode 602. The antenna 601 comprises a first arm 604 and a second arm 605. The diode 602 comprises an n-doted layer 606 and a p-doted layer 607. The n-doted layer 606 comprises two electrodes or electrode parts 608a and 608b. The first arm 604 of the antenna 601 is connected at a first termination point 609a to the electrode 608a and the second arm 605 at a second termination point 609b to the second electrode 608b.

The diode 602 is operated in a forward-biased mode. This is established by applying a positive voltage $V_D$ to the p-doted layer 607.

The resistance between the electrodes 608a and 608b functions as matching impedance for the antenna 601. The electromagnetic radiation received by the antenna 601 is converted to heat right between these electrodes. This heats up the depletion layer between the n-doted layer 606 and the p-doted layer 607. This in turn affects and influences the forward current of the diode 602 which is measured as temperature-dependent characteristic by means of a current meter 610.

Figure 6B:
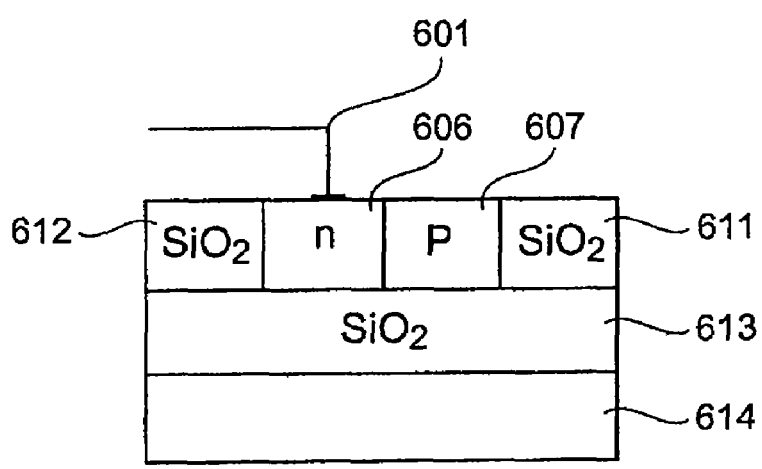

FIG. 6b shows a cross section of the diode 602. Next to the n-doted layer 606 and the p-doted layer 607 there are arranged thermally insulating layers 611 and 612 of Silicon-Dioxide or of another thermally insulating material. Below the layers 606, 607, 611 and 612 there is provided another thermally insulating layer 613 of Silicon-Dioxide or of another thermally insulating material. Below the layer 613 there is provided a base layer 614 of a semiconductor material, in particular Silicon.

Figure 7:
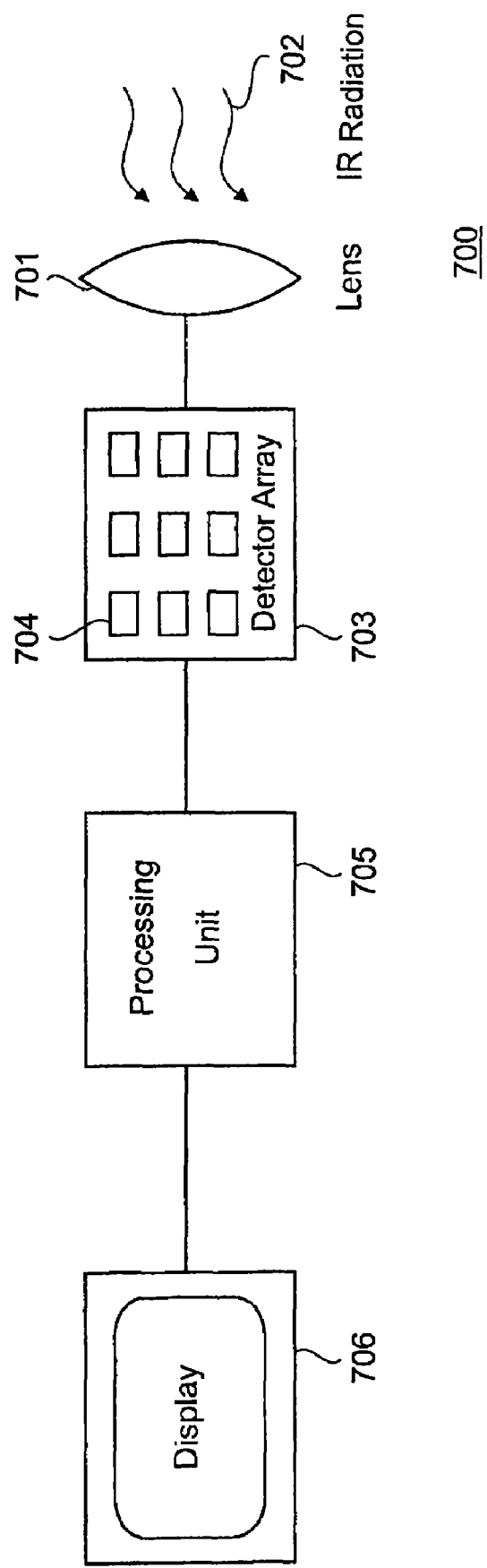
FIG. 7 shows a schematic illustration of a thermal imaging device.

FIG. 7 shows a schematic illustration of a thermal imaging device 700 according to an embodiment of the invention. The thermal imaging device 700 comprises a lens 701 for focusing the electromagnetic waves 702 on a detector array 703. The detector array 703 comprises several detectors 704 arranged in rows and columns for detecting the electromagnetic waves 702. The lens 701 can be made movable, so that the incident electromagnetic waves (radiation) 702 can be focused on a single row of the detector array 703 or even on a single detector 704. This corresponds to a scanning imaging device.

The thermal imaging device 700 comprises a processing unit 705 for processing detector signals received from the detectors 704. The processed detector signals are forwarded to a display 706 that is provided for displaying thermal images of the received electromagnetic waves 702.

Figure 8:
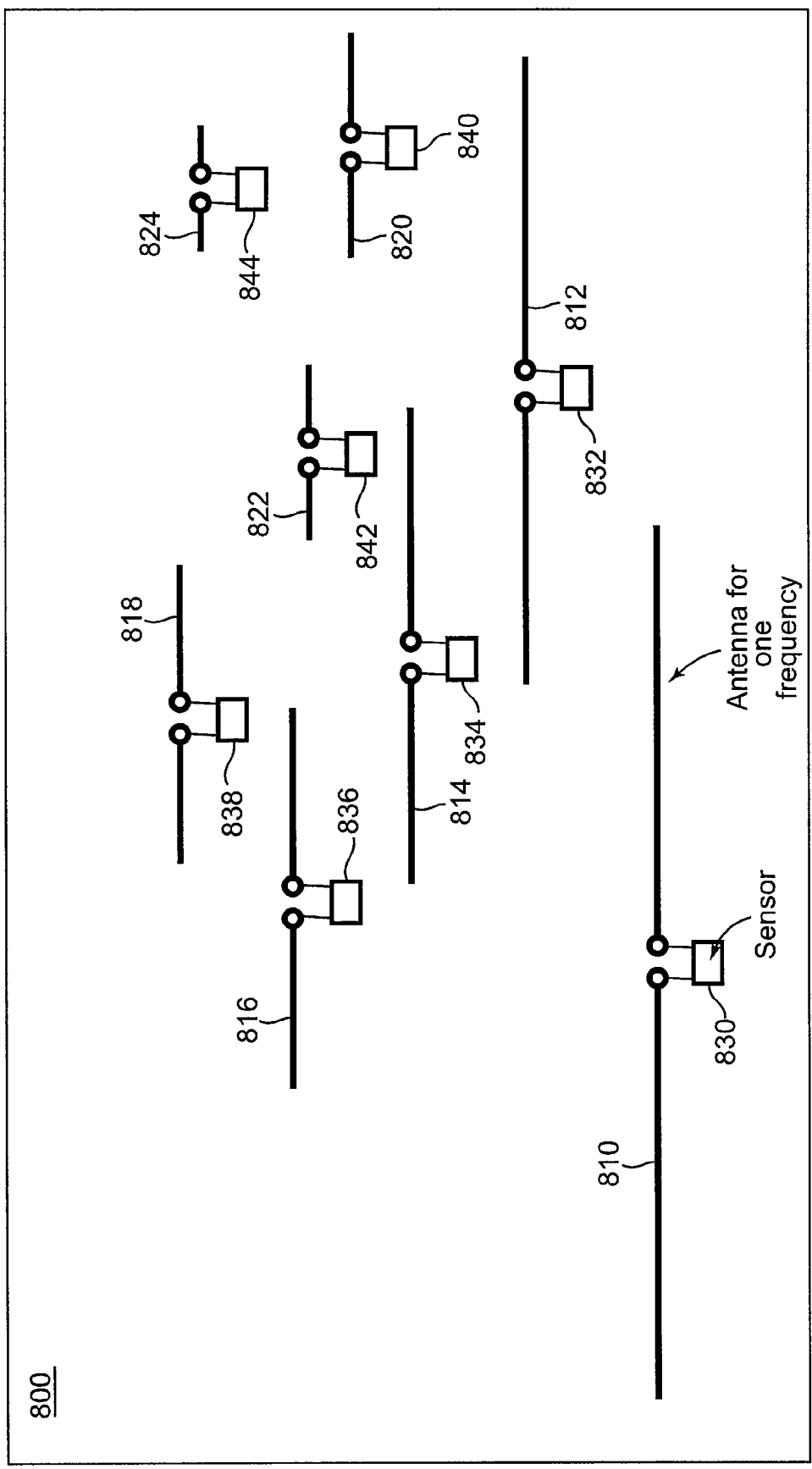
FIG. 8 shows a top view of one embodiment of a spectrometer chip.

Utilizing the bolometer technology outlined above, the present invention can provide a broad frequency spectrometer, capable of detecting radiation across a broad range of frequencies. Referring now to FIG. 8, a top schematic view of such a device is illustrated. More specifically, FIG. 8 illustrates the top view of a first spectrometer chip 800 having a plurality of antenna elements all placed upon the surface thereof. As shown in FIG. 8, first spectrometer chip 800 includes a first antenna through eighth antenna (810, 812, 814, 816, 818, 820, 822 and 824, respectively). As can be seen, each of these antennas are linear in nature and sized slightly differently, thus causing each antenna to be sensitive to different frequencies of radiation. Each antenna is electrically coupled to a related sensor. As shown, first antenna 810 is electrically coupled to first sensor 830, second antenna 812 is electrically coupled to a second sensor 832, etc. In this particular embodiment, first through eighth sensors (830, 832, 834, 836, 838, 840, 842, 844 and 846) are utilized to read signals detected by the related antenna. By providing an appropriate number of antennas and related sensors, a very broad spectrum of sensitivity can easily be achieved. The present invention generally contemplates the possibility of many more antennas than illustrated in FIG. 8. For example, it is entirely possible to fabricate first spectrometer chip 800 having as many as two hundred (200) antennas on a surface thereof. It is also contemplated that the spectrometer would effectively operate for the mm and sub mm (THz) frequency range. This broad range of operation in a compact package provides many advantages. While the actual management and connections for these multiple antennas may be somewhat challenging, the ability to fabricate such antennas using CMOS chip manufacturing techniques can be easily undertaken.

Figure 9:
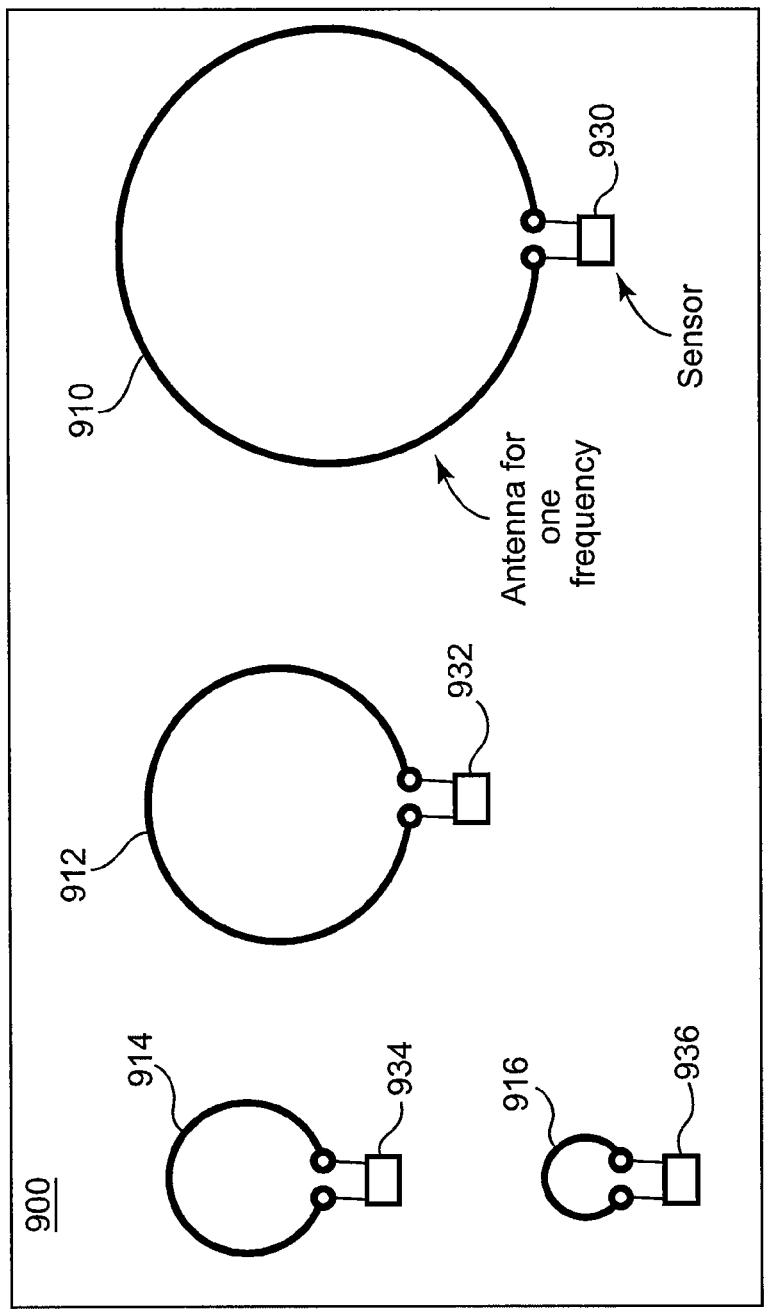
FIG. 9 shows a top view of a second embodiment of the spectrometer chip of the present invention.

As an alternative, FIG. 9 illustrates a similar second spectrometer chip 900 having first through fourth circular antennas (910, 912, 914 and 916, respectively) configured on the surface thereof. Again, each antenna is sized slightly differently to respond to signals of different frequencies. Further, second spectrometer chip 900 includes first through fourth sensors (930, 932, 934 and 936) each coupled to a corresponding antenna. Again, each sensor will provide the ability to detect signals generated by the respective antennas, thus allowing for the detection of radiation of differing frequencies.

Although not shown, first spectrometer chip 800 and second spectrometer chip 900 also include connections to further components. For example, first through eighth sensors (810, 812, 814, 816, 818, 820, 822 and 824) may each be connected to an appropriate communication bus, thus allowing their outputs to be passed along to other devices.

Figure 10:
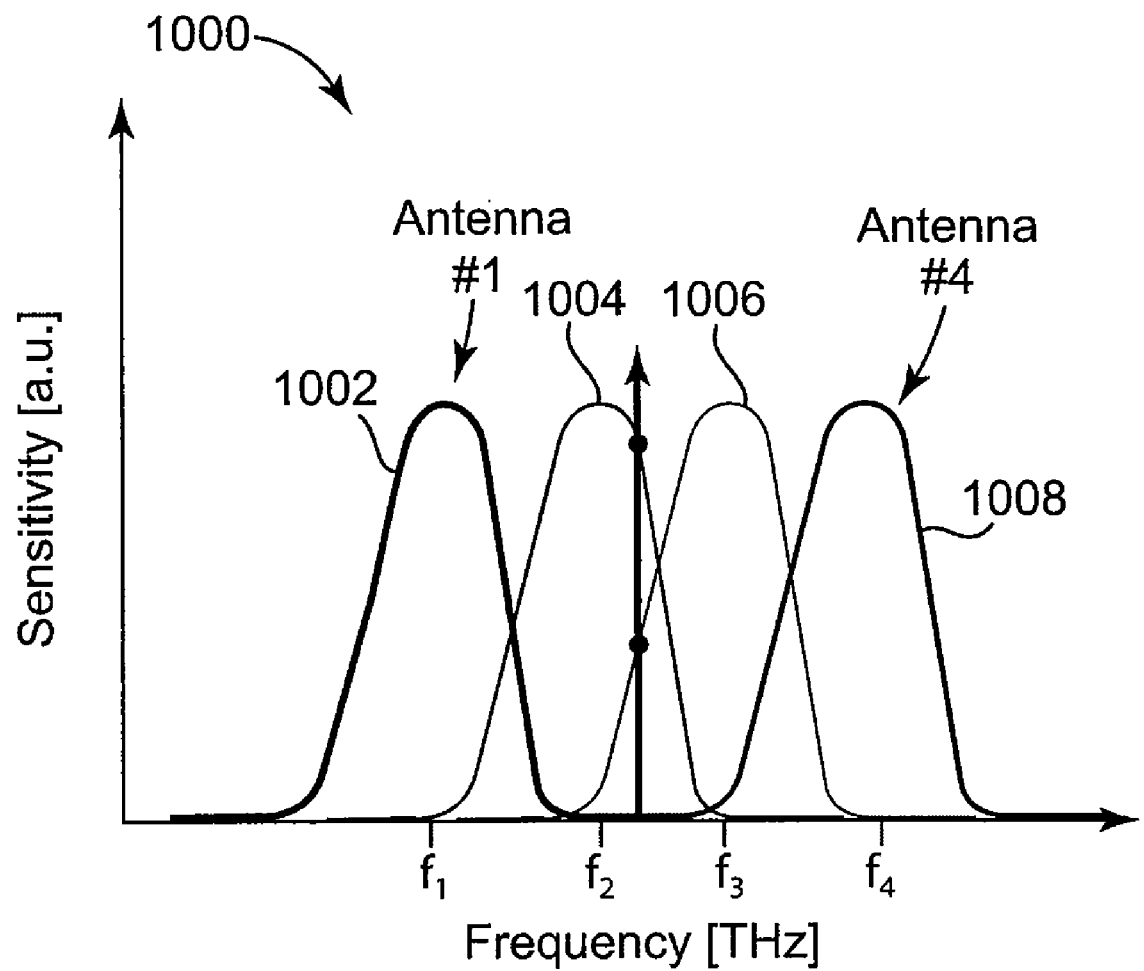
FIG. 10 is a spectral graph illustrating the spectral operation of the spectrometer.

Referring now to FIG. 10, there is illustrated a simplified spectral graph illustrating the operation of the multiple antennas. Simply stated, each of the antennas are responsive to a defined frequency range, based upon their physical configuration. Spectral graph 1000 illustrates four different frequency response curves: first curve 1002, second curve 1004, third curve 1006 and fourth curve 1008. As can be seen, each curve provides a peak centered around a particular frequency, $f_1, f_2, f_3$ and $f_4$. Spectral graph 1000 can correlate with second spectrometer chip 900 in that it simply illustrates the frequency response of four different antennas. In this example, peak 1002 corresponds to first antenna 910, peak 1004 corresponds to second antenna 912, third peak 1006 corresponds to third antenna 914, and fourth peak 1008 corresponds to fourth antenna 916. When combined with another, the overall frequency response of spectrometer chip 900 allows for the detection and differentiation of radiation signals having different frequencies. Consequently, the above-discussed spectrometer operation is achieved.

While first spectrometer chip 800 and second spectrometer chip 900 are illustrated above, it will be understood that many variations and adaptations of these designs could be easily utilized. The particular antenna design and the number of antennas will affect the overall operation. More specifically, each antenna may be designed to have its own desired bandwidth, which thus must cooperate with other antennas configured on the particular spectrometer chip. It is generally intended that each antenna will be configured as a relatively narrow band antenna, thus providing the ability to specify and differentiate particular frequencies. It is contemplated that various designs for the particular antenna utilized, and the collection of antennas as a whole, can be varied depending upon the design goals for the particular spectrometer chip. In addition, it is possible to configure the antennas to provide polarity information for the detected electromagnetic wave, should that information be valuable.

Any disclosed embodiment may be combined with one or several of the other embodiments shown and/or described. This is also possible for one or more features of the embodiments. The present invention is further not intended to be limited to the embodiments shown, but rather is intended to include all modifications and variations coming within the scope and spirit of the following claims.

What is claimed is:

1. A method of creating an efficient and miniaturized chip based spectrometer responsive to a wide band of frequencies of electromagnetic radiation, comprising:

forming a plurality of transistors on a substrate, wherein each transistor has a gate, a related source element and a related drain element;

creating a plurality of antenna elements above each transistor, with each antenna element having a first connection and a second connection, with the first connection electrically connected to one side of the gate of the corresponding transistor and the second connection electrically connected to an opposite side of the gate of a corresponding transistor element thereby allowing real current to pass from the antenna and through the gate, the antenna configured to receive electromagnetic radiation and convert such electromagnetic radiation to electrical current, which is then passed to the gate of the corresponding transistor causing the gate to be heated and change its electrical characteristics, wherein the plurality of antenna elements are each configured to have slightly different dimensions thereby responding to different frequencies of electromagnetic radiation, with the different frequencies selected to span a predetermined frequency range and with each of the different frequencies being substantially equally spaced across the predetermined frequency range; and electrically connecting the plurality of transistors to a plurality of amplifiers, wherein the plurality of amplifiers produce a plurality of outputs with each output of the plurality of outputs producing a signal proportional to the current generated by the corresponding plurality of antennas.

* * * * *